United States Patent
Granoff et al.

(10) Patent No.: US 6,465,729 B2
(45) Date of Patent: Oct. 15, 2002

(54) SURFACE TRACE ELECTRICAL FEEDTHRU FOR CONDUCTING ELECTRICITY ACROSS A PRESSURE ENVELOPE

(75) Inventors: Mark S. Granoff, Auburn; Phillip D. Demaine, Epping, both of NH (US); David Broderick, Beverly; Stephen Ingemi, Melrose, both of MA (US)

(73) Assignee: University of New Hampshire, Durham, NH (US)

( * ) Notice: Subject to any disclaimer, the term of this patent is extended or adjusted under 35 U.S.C. 154(b) by 0 days.

(21) Appl. No.: 09/814,880

(22) Filed: Mar. 22, 2001

(65) Prior Publication Data

US 2001/0019755 A1 Sep. 6, 2001

Related U.S. Application Data

(62) Division of application No. 09/310,435, filed on May 12, 1999, now Pat. No. 6,251,471.

(51) Int. Cl.⁷ .................................................. H05K 5/06
(52) U.S. Cl. ................. 174/18; 174/14 BH; 174/50.52; 174/50.58; 174/202
(58) Field of Search ................................. 174/18, 31 R, 174/11 BH, 50.57, 50.52, 50.64, 50.58, 152 R, 152 GM, 202, 14 BH

(56) References Cited

U.S. PATENT DOCUMENTS

| | | | | |
|---|---|---|---|---|
| 3,660,593 A | * | 5/1972 | Bowies | 174/152 R |
| 4,458,101 A | * | 7/1984 | Cookson et al. | 174/31 R |
| 4,508,753 A | * | 4/1985 | Stepan | 427/53.1 |
| 4,532,152 A | * | 7/1985 | Elarde | 427/96 |
| 4,584,429 A | * | 4/1986 | Raketti et al. | 174/18 |
| 4,804,330 A | * | 2/1989 | Makowski et al. | |
| 5,276,963 A | * | 1/1994 | Flanders | 29/852 |
| 5,683,435 A | * | 11/1997 | Truex et al. | 607/37 |
| 6,305,975 B1 | * | 10/2001 | Steiner | 439/559 |

* cited by examiner

Primary Examiner—Albert W. Paladini
(74) Attorney, Agent, or Firm—Devine, Millimet & Branch, P.A.; Paul C. Remus; Todd A. Sullivan

(57) ABSTRACT

A method for producing an electrical feedthru wherein a thin liquid conductive film is deposited into a shallow trough of an insulating machinable substrate. The conductive film and substrate are fired and then the resulting bound composite is ground flush with the adjacent surface of the insulating machinable substrate. The surface cohesion of the fired composite, and the resulting high quality surface finish of the grinding operation, combined with an elastomeric seal, create low leakage barriers capable of supporting a pressure differential while allowing isolated electrical conduction across a pressure or vacuum envelope. The method produces a space saving feedthru which allows a high signal line density in a limited space, is relatively simple to assemble, allows for disassembly rework, can be 'designed into' unique geometries of varied applications, and which has a single O-ring sealing across all traces. The resulting electrical trace can be soldered directly to a signal carrying wire, pin/socket, or attached via a contact spring or other mechanical attachment. No epoxies are used, thus avoiding thermal limitations and outgassing contamination.

9 Claims, 4 Drawing Sheets

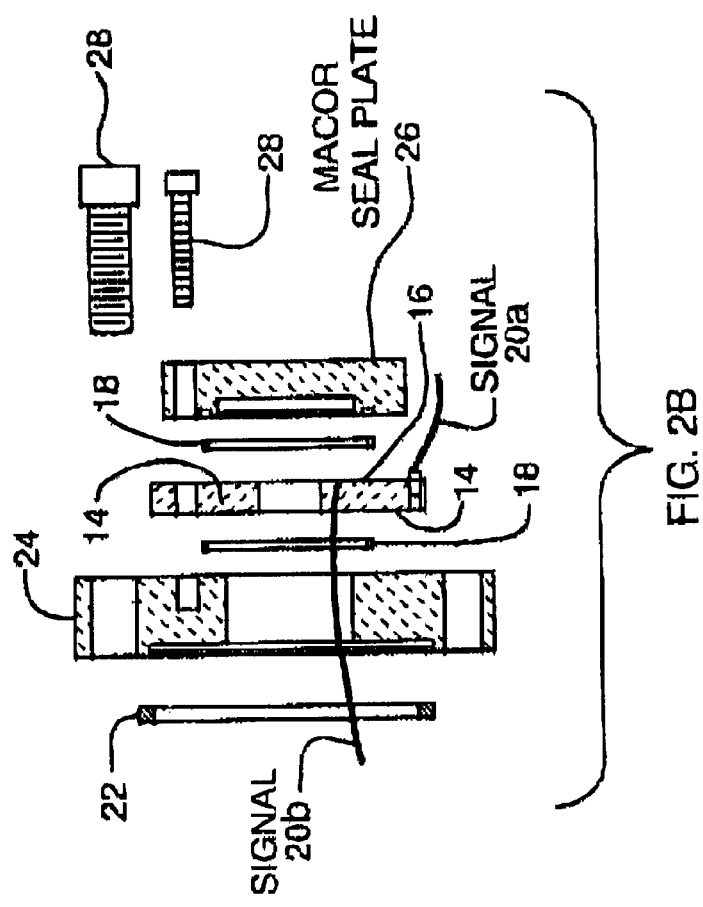
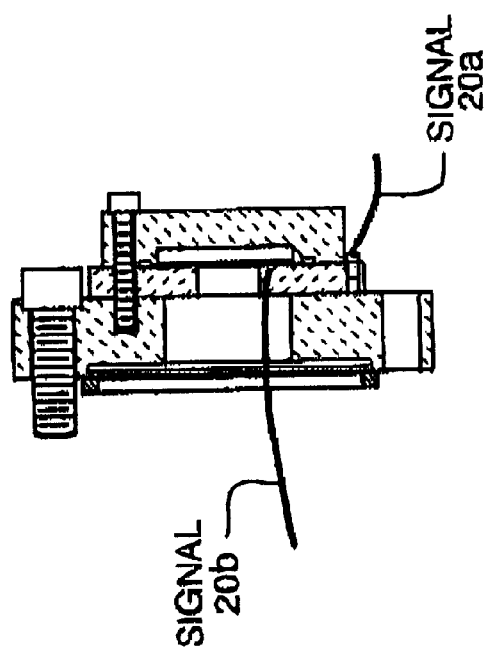
FIG. 2B
FIG. 2A

SURFACE TRACE ELECTRICAL FEEDTHRU FOR CONDUCTING ELECTRICITY ACROSS A PRESSURE ENVELOPE

The instant application is a divisional application claiming benefit of a parent application, U.S. patent application Ser. No. 09/31043. Filing date May 12, 1999. U.S. Pat. No. 6,251,471.

This invention was funded in part by the National Aeronautics and Space Administration of the United States Government under contract No. NAS532626.

FIELD OF THE INVENTION

This invention most generally relates to electrical connectors. More particularly the invention relates to passing electrical current across a barrier having different pressures on either side. Most particularly the invention relates to methods of creating electrical feedthrus for conduction across pressure envelopes where a high vacuum or pressure must be maintained.

BACKGROUND OF THE INVENTION

There currently exist a variety of methods and devices for passing electrical current across a barrier having significant pressure differences on either side. There is a need for such methods and devices for use with electrical and optical systems which use vessels that maintain pressure differentials between the inside and outside of the vessel. Such systems include many that are used with lasers, charge coupled device (CCD) arrays, and outer space applications which use vacuum cavities, as well as systems with pressurized containers.

Various methods of creating electrical feedthrus for conduction across pressure envelopes include epoxy encapsulation of insulated wires within a metal interface housing, and metal to insulator glass firing of single conductors within an interface housing.

It is a widely recognized problem in the field that, in systems which require electrical feedthrus across pressure differentials, the location and construction of the feedthrus are often the site of leaks which can cause hazards in the operation of the systems. Other disadvantages to the above methods include epoxy thermal limitations, vacuum outgassing, and leakage repair limitations for the epoxy type feedthru.

An example of the current state of the art of electrical feedthrus for connection across a pressure barrier is that of U.S. Pat. No. 4,804,330 to Makowski et al. which discloses a Hermetic, Vacuum and Pressure Tight Electrical Feedthru. Makowski et al. discloses a leak tight electrical feedthru for vessels which may be evacuated or pressurized relative to the outside ambient conditions. The Makowski et al. feedthru comprises: a ceramic circuit ring which circumscribes the walls of a vessel which is either pressurized or evacuated; the walls of the vessel have an inner circumference which extends into the interior of the vessel and an outer circumference which is exterior to the vessel; a first set of electrical contacts distributed about the inner circumference and demountably connecting with an interior set of electrical cables; a second set of electrical contacts distributed about the outer circumference and demountably connecting with an exterior set of electrical cables; a plurality of filaments fixed on the ceramic circuit ring each of which connects one of the first set of contacts with one of the second set of contacts; and a means for hermetically sealing the ceramic circuit ring to the walls of the vessel. The means for hermetically sealing is via firing a ceramic annular seal ring, which covers the plurality of filaments and fits between the walls of the vessel and the ceramic circuit ring. Metal rings are brazed to the resulting fused module, allowing welding to a housing and common mechanical assembly techniques. The ceramic circuit ring is then bolted to pull the wall sections tight against the annular seal.

None of the above methods has proved suitable for certain applications involving pressure extremes such as outer space applications. Thus there is still a need for a better, more easily reparable, more leak tight method or system for passing electrical current across a pressure envelope.

SUMMARY OF THE INVENTION

An embodiment of the invention is a method for producing an electrical feedthru comprising electrical traces wherein a thin conductive film is deposited into a shallow trough milled in an insulating machinable ceramic substrate, such as a substrate made of MACOR insulating material. The conductive film filling is metalized by firing and the resulting composite, which is the metalized, bonded conductive film and substrate after firing, is then ground flush with the adjacent surface of the insulating machinable ceramic substrate. The surface cohesion of the fired composite (the bonding between the conductive film and substrate material), and the resulting high quality surface finish of the grinding operation, combined with an elastomeric seal, create low leakage barriers capable of supporting a pressure differential while allowing isolated electrical conduction across a pressure or vacuum envelope. The bond between the substrate made of the MACOR insulating material and the metallized trace is virtually leak tight, and the surface finish after grinding is O-ring seal quality. The resulting surface electrical traces can be soldered directly to a signal carrying wire, pin/socket, or attached via a contact spring or other mechanical attachment. The traces are solderable in their fired state, thereby allowing wires to be soldered inside an O-ring envelope, and an electronics interface connector to be soldered outside the envelope. The method produces a space saving feedthru requiring significantly less volume for a given signal line than conventional feedthrus, which allows a high signal line density in a limited space. It is relatively simple to assemble—no adhesives are required and fewer seal elements are needed than with current technology, and there is single O-ring sealing across all traces. Applications of the flush grinding of a conductive trace into the surface of an insulator include, by way of non-limiting example, outer space applications such as in gas filled proportional counter plates for NASA instruments, commercial vacuum feedthrus, vacuum testing devices, glove boxes, or other pressure differential applications such as sealed pressure transducers, other positive pressure electrical feedthrus requiring space conservative solutions, or undersea applications for example in submarines, submersibles or scientific equipment. Conductive trace plates of the present invention used in various applications can be removed or replaced without wasting or destroying the rest of the particular assembly.

Therefore one aspect of the invention is to form a virtually leak tight electrical feedthru.

Another aspect of the invention is to provide high signal line density capacity in a limited space, and which can form electrical connections across a vacuum or pressure envelope.

A further aspect of the invention is to provide an electrical feedthru that is simple to assemble and does not require adhesives.

Yet another aspect of the invention is to provide an electrical feedthru trace which has a surface of O-ring sealing quality and which is sealable with a single O-ring across all the electrical traces.

A still further aspect of the invention is to provide a removable conductive trace plate to allow repair and replacement of the electrical connections across a pressure barrier without destroying the complete assembly or device using the electrical trace connections.

Yet another aspect of this design is the flexibility to add the feedthrus to unique geometries of varied design applications.

These and other aspects of the invention, together with other aspects, features and advantages of the invention will be apparent from the following non-limiting description, when taken in conjunction with the accompanying drawings.

BRIEF DESCRIPTION OF THE DRAWINGS:

FIG. 2A is a side view of the entrance structure to a vacuum chamber, using the surface trace electrical feedthru in one particular configuration.

FIG. 2B is an exploded view showing the assembly of the entrance structure shown in FIG. 2A.

Figure 1:
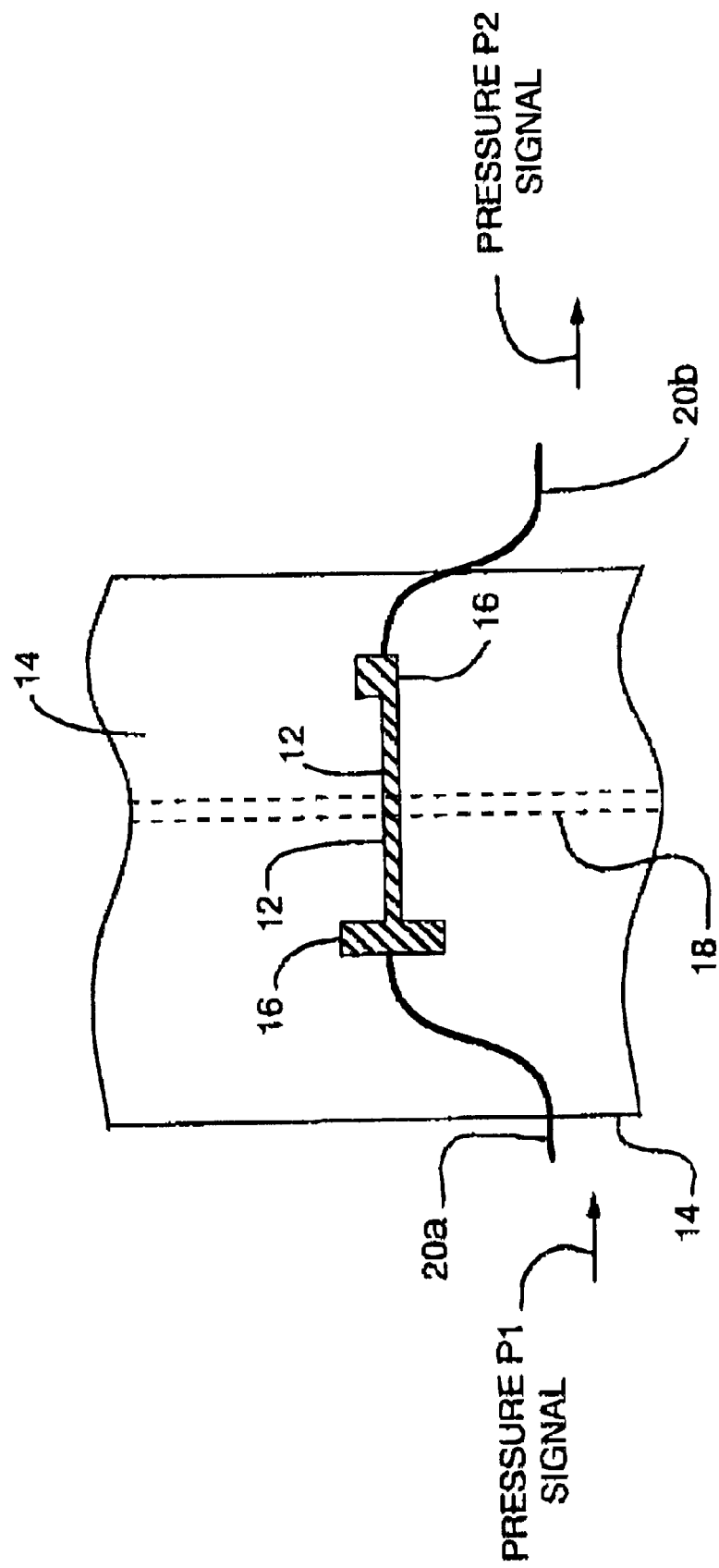
FIG. 1 is plan view, from above, of a surface trace electrical feedthru of the present invention.

DETAILED DESCRIPTION OF THE INVENTION:

Referring now to the figures in which like elements correspond to like reference numerals throughout, FIG. 1 shows an isolated view of the placement and construction of a single surface trace electrical feedthru 10 of the present invention, for use across a pressure or vacuum envelope where there is pressure P1 on one side of the envelope, for example the outside which is at ambient pressure, and pressure P2 on the other side of the envelope, for example the inside which is either evacuated or pressurized. A shallow trough 12 is milled in each substrate 14 by standard milling practices known in the art. Trough 12 is preferably about 0.007 to 0.009 inches deep for best results. The depth of trough 12 is important because if trough 12 is too shallow, the final grinding will remove metal trace 16, and if trough 12 is too deep, poor deposition, firing and surface finish result. Carbide tools are preferably used for the milling process to avoid tool erosion and to obtain clean machine cuts.

The substrate 14 is preferably an insulating machinable glass ceramic material such as CORNING MACOR (R) insulating material that has the attributes of both machined parts and electrical insulators. Milling of the MACOR insulating material is performed in accordance with the CORNING recommendations. The MACOR insulating material can be inexpensively precision machined with standard metal working tools, and requires no post firing after machining. MACOR insulating material holds tight tolerances (up to 0.0005 inches), can withstand temperatures up to 1000 degrees C (no load) with a continuous use temperature of 800 degrees C and has no outgassing and zero porosity. The MACOR insulating material matches most metals and sealing glasses' coefficient of thermal expansion, and can be joined or sealed both to itself and to other materials. It is an excellent insulator at high voltages, various frequencies and high temperatures.

Each trough 12 is filled with a thin film of liquid conductive material which, upon firing, forms solid metal film electrical trace 16. Troughs 12 are filled completely, preferably by painting or brushing the liquid conductive material into the milled trough, but could be filled by dipping, spraying or screen printing methods as well. Preferably, conductive material trace material 16 is DUPONT silver #7713 which is a liquid metal formulation of silver palladium alloy, or similar alloy of approximately 70% silver usable for application on glass, quartz or PZT bodies. Silver is chosen because it is an excellent electrical conductor, and because conductivity is not significantly lost in the event of exposure to the environment. Many metals that are excellent conductors respond to environmental exposure, and are readily oxidized through simple exposure to the air. The resulting oxides are often not electrically conductive. Therefore conductivity degrades in proportion to environmental exposure and oxidation. However, silver oxide, silver sulfite, and even silver carbonate are only slightly less conductive than silver metal. Thus conductivity degradation problems are reduced or eliminated using silver alloys to produce electrically conductive paths, patterns or films over nonconductive surfaces.

Thus, any material with the appropriate conductivity characteristics may be used. Other characteristics necessary for the conductive material include; firing, machining, soldering, and adhesion characteristics. The conductive film must be firable at temperatures that will not crack the substrate (if firing temperatures are too high), it must machine well to form a smooth surface, it must adhere well to the substrate material, and must be able to be soldered to attach electrical connections.

After filling, substrate 14 and the conductive material film in trough 12 are then fired to metalize to form the composite electrical feedthru trace 16 bonded to substrate 14 in trough 12. Metalization is the process of forming a composite metal solid film from a liquid metal formulation via a thermal firing process. An example firing process would be that recommended by DUPONT for its silver and silver-palladium alloys such as the 7713 alloy and includes: applying the conductive film to the troughs 12 and allowing the painted film to set at room temperature for approximately about 10–20, and preferably 15 minutes, oven drying the substrate 14 and film in air at approximately about 120–130 degrees Centigrade (C), and preferably about 125 degrees Centigrade for about 10–20, and preferably about 15 minutes to remove solvent, firing in an air retort furnace with a ramp up of approximately about 10 degrees C per minute, holding at about 520–530, and preferably about 525 degrees C for about 10 minutes, then cooling at preferably less than 10 degrees C per minute to room temperature. Firing conditions may be adjusted and optimized for local conditions, the particular substrate and conductive film used.

Figure 2C:
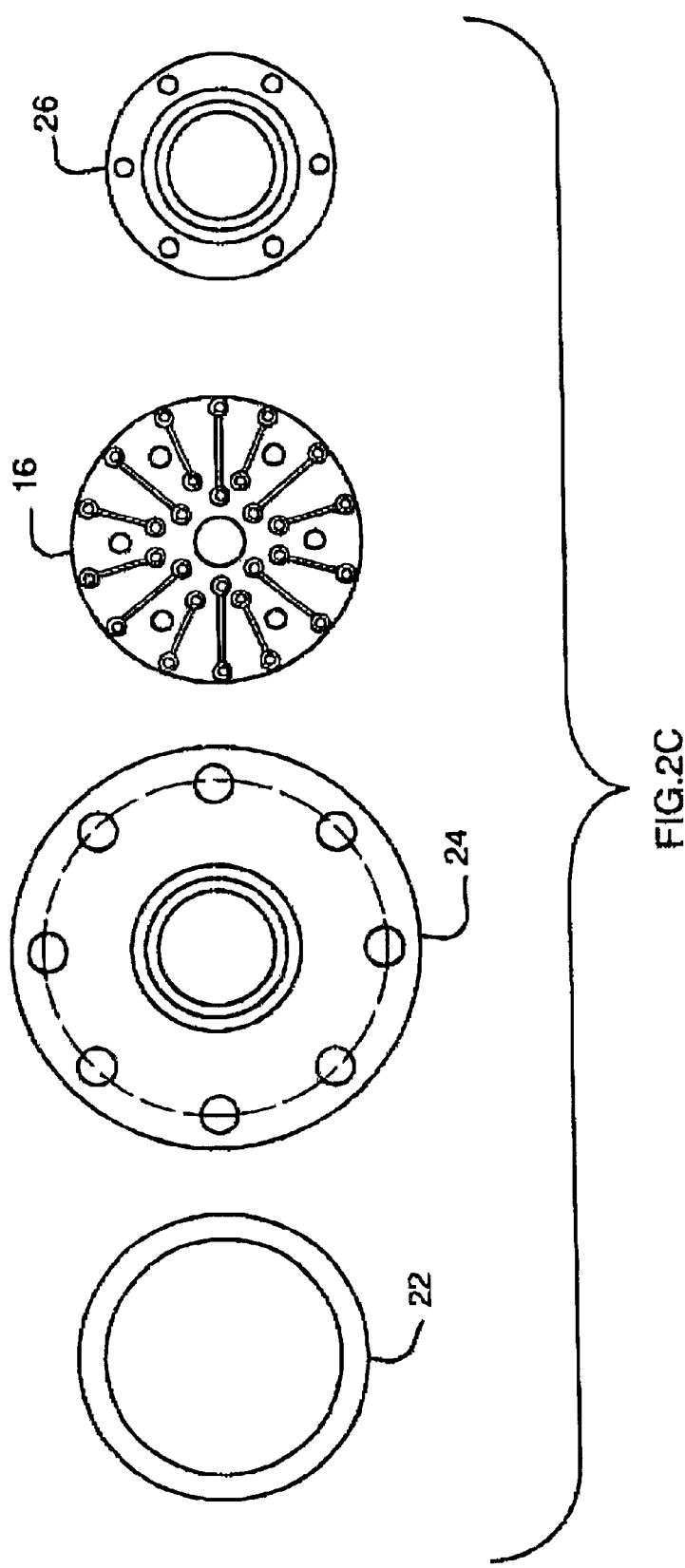
FIG. 2C shows plan views of various members of the entrance structure, including a plan view of the surface trace electrical feedthru using eighteen traces.
Figure 3:
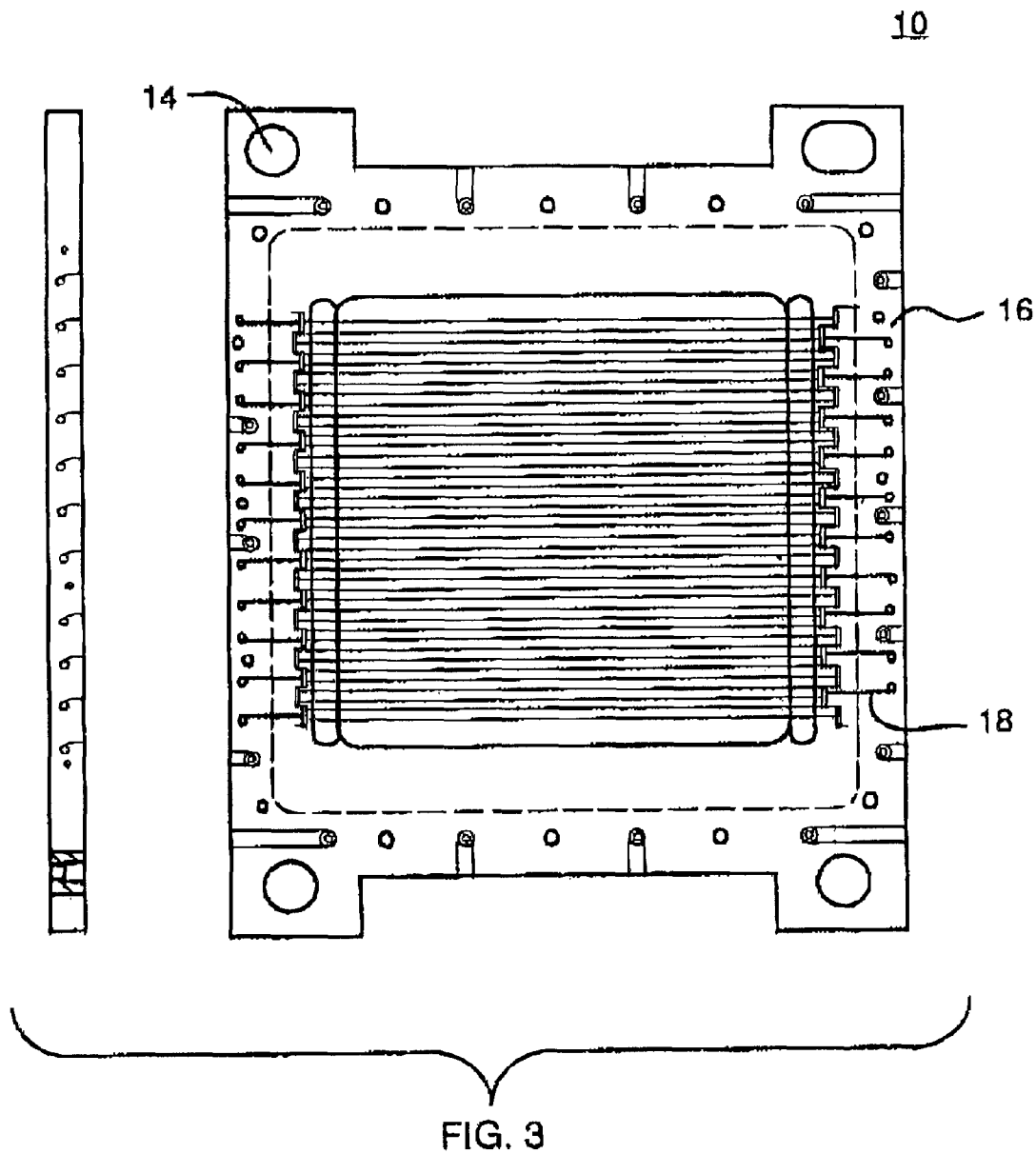
FIG. 3 is a plan view, from above, of a substrate, using surface trace electrical feedthrus of the present invention in a second configuration.

After firing, the surfaces of substrate 14 and conductive material trace 16 are ground flush. The surface of both the substrate and trace are ground, and a trough starting at about 0.007–0.009 inches in depth may result in a 0.003–0.004 inch deep trough after grinding. FIG. 1 shows a single trace 16, however many such traces may be formed in a substrate. For example 18 traces are shown in FIG. 2C and 21 traces are shown in FIG. 3. Each trace 16 is preferably about $\frac{1}{32}$ inches wide.

Cohesion between the fired conductive material trace 16 and the MACOR insulating material, substrate 14, creates a leakage barrier with a high quality surface finish. After grinding, a single removable O-ring 18 inserted at the seal creates a second leakage barrier. A single O-ring is used in embodiments of this invention to seal across the traces 16. Additional O-rings may be used in other steps in assembly of devices using electrical feedthru trace plates of the present invention. The removable O-ring of the present invention is in contrast to the fixed, fired seal of Makowski et al. whose device relies on the firing of a ceramic seal ring across the metallized traces. The Makowski device relies on the firing to make a hermetic barrier. The leakage rate across the pressure envelope, using the method and device of the present invention, is less than $1.\times 10-7$ cc/sec of Helium. A typical O-ring usable with the present invention is an 026 VITON O-ring, or a BUNA-N O-ring, or any conventional material having the necessary characteristics for the particular desired application. For example some applications may require a petroleum-resistant O-ring material, others may require seawater or salt resistance. The finished, ground trace 16 can then be soldered to incoming and outgoing wires 20a and 20b which pass signal across the pressure envelope via traces 16. Wires 20a and 20b are then connected to devices inside and outside the pressure envelope. Wires usable with the present invention are, conventional multi- or single strand, and are soldered with preferably a 2% Ag (silver) solder. Signal is carried across the pressure envelope via the surface trace electrical feedthru of the present invention.

Shown in FIGS. 2A, 2B and 2C is a commercial embodiment of the invention usable with commercial vacuum applications. FIG. 2A shows the entrance to a vacuum chamber, with the surface trace electrical feedthrus assembled in the entrance mechanism wherein atmospheric pressure is present on one side of the entrance and a vacuum is present on the other. Wires are soldered to the completed surface trace electrical feedthru 10 and extend into and out of the vacuum chamber. FIG. 2B is an exploded view of FIG. 2A showing the surface trace electrical feedthru assembly 10. Wires 20a and 20b are connected to the individual traces 16 that are flush with substrate plate 14. Running the wires (20a, 20b) through substrate plate 14 helps to hold the wires in place thereby relieving strain on the connection of the wire to the trace. However, running wires through substrate plate 14 has no impact on the seal integrity. Two O-rings 18 may be used, one on either side of substrate plate 14 for a particular application. The number and location of additional O-rings depend on the particular application.

For example, as shown in FIGS. 2A, 2B, and 2C in a particular commercial application of the invention, the invention may be used to communicate across a vacuum seal having, on the interface side of the assembly, preferably a copper gasket 22 (a common VARIAN vacuum part), with a knife edge vacuum seal, for example a CONFLAT (TM) flange 24 which is a combination of the copper gasket 22 and knife edge sealing flanges. This type of seal, using a copper gasket, is a common type of seal, whereby soft copper is clamped between two sharp knife edges and results in a leak-tight crushed mating surface under high stress. Flange 24 is adjacent to one of the O-rings 18. Between the two O-rings 18 is the substrate plate 14 with traces 16. Cohesion between the MACOR substrate 14 and the silver alloy traces 16 creates a leakage barrier and the O-ring across traces 16 creates a second leakage barrier. The outermost portion of the particular assembly shown in FIGS. 2A–2C is a "seal" plate 26 constructed with MACOR insulating material. The assembly is held together by bolts 28. FIG. 2C shows, from left to right, plan views of copper gasket 22, flange 24, substrate 14 having eighteen traces 16, and seal plate 26. In FIGS. 2A–2C substrate 14 is a plate preferably about 2.25" in diameter.times.0.25" thick. The illustration of the invention shown in FIGS. 2A–2C is simply one example of an application for which the invention may be used.

FIG. 3 shows another embodiment of the surface trace electrical feedthru 10 of the present invention, as used in various outer space applications. Substrate plate 14 is rectangular, and there are shown twenty-one (21) traces 16 in substrate 14. Substrate plate 14 is preferably approximately about 5 inches×6.5 inches in size. The number of traces per plate depends only on the practical geometry of the plates and the particular application. The number of plates used, the number and type of O-rings and any attachment means or additional structural components depend on the particular application and use of the flush feedthru traces of the present invention.

While the invention has been described in its preferred embodiments, it is understood that the above description is illustrative and not limiting, and that changes may be made which do no depart from the scope and spirit of the invention as defined in the claims.

Accordingly, what is claimed is:

1. A surface trace electrical feedthru for conducting electricity across a pressure envelope, said feedthru comprising:
   a substrate having at least one trough;
   at least one solid metal film electrical trace bonded to said substrate within said trough, wherein said at least one electrical trace and said substrate are ground flush to form a flat, O-ring quality surface; and
   an elastomeric seal across at least one of the electrical traces and at least a portion of the substrate thereby sealing the trace across the pressure envelope.

2. The surface trace electrical feedthru of claim 1 wherein said substrate is an insulating machinable ceramic.

3. The surface trace electrical feedthru of claim 1 wherein said at least one electrical trace is comprised of an alloy comprising silver.

4. The surface trace electrical feedthru of claim 3 wherein said alloy comprises about 70% silver.

5. The surface trace electrical feedthru of claim 4 wherein said alloy is a liquid metal formulation of silver palladium alloy.

6. The surface trace electrical feedthru of claim 1 wherein the elastomeric seal is substantially planar to said at least one electrical trace and the substrate.

7. A surface trace electrical feedthru comprising:
   a substrate;
   a trough in the substrate;
   a conductive film deposited in the trough and fired, wherein the fired film and substrate are ground flush; and
   a removable O-ring placed across the fired film thereby sealing for pressure differences.

8. The feedthru of claim 7 wherein the feedthru is placed across a pressure barrier.

9. The feedthrus of claim 7 wherein the trough is at least 0.005 inches deep prior to grinding flush the substrate and the fired film.

* * * * *